United States Patent [19]

Abrahamovich et al.

[11] 4,377,633
[45] Mar. 22, 1983

[54] METHODS OF SIMULTANEOUS CONTACT AND METAL LITHOGRAPHY PATTERNING

[75] Inventors: Karen M. Abrahamovich, South Burlington; Clifford J. Hamel, Jericho; Edward H. Payne, Essex Junction; Dean R. Weed, South Burlington, all of Vt.

[73] Assignee: International Business Machines Corporation, Armonk, N.Y.

[21] Appl. No.: 295,477

[22] Filed: Aug. 24, 1981

[51] Int. Cl.³ .......................... G03C 5/04; G03C 5/00
[52] U.S. Cl. ................................. 430/312; 430/314; 430/315; 430/317; 430/394; 430/952; 156/661.1
[58] Field of Search ............... 430/311, 312, 314, 317, 430/315, 952, 394; 156/661.1, 659.1

[56] References Cited

U.S. PATENT DOCUMENTS

| | | | |
|---|---|---|---|
| 3,421,206 | 1/1969 | Baker et al. | 29/589 |
| 3,506,442 | 4/1970 | Kerwin | 430/952 |
| 3,594,168 | 7/1971 | Compare | 430/312 |
| 3,661,582 | 5/1972 | Broyde | 430/191 |
| 3,784,380 | 1/1974 | Compare | 430/952 |
| 3,890,152 | 6/1975 | Ruckert et al. | 430/157 |
| 3,930,857 | 1/1976 | Bendz et al. | 430/313 |
| 4,040,891 | 8/1977 | Chang et al. | 156/657 |
| 4,104,070 | 8/1978 | Moritz | 96/36 |
| 4,320,190 | 3/1982 | Ruedin | 430/314 |
| 4,356,254 | 10/1982 | Takahashi et al. | 430/325 |
| 4,356,255 | 10/1982 | Tachikawa et al. | 430/325 |

FOREIGN PATENT DOCUMENTS 2521727  12/1975  Fed. Rep. of Germany ...... 430/326

OTHER PUBLICATIONS

Berker et al., "Dual-Polarity, Single-Resist Mixed (E--Beam/Photo) Lithography", IEEE Electron Device Letters, vol. EDL-2, No. 11, Nov. 1981, pp. 281-283.
IBM Technical Disclosure Bulletin, vol. 23, No. 5, 1980, p. 1839.

*Primary Examiner*—Mary F. Downey
*Attorney, Agent, or Firm*—Francis J. Thornton

[57] ABSTRACT

This describes different methods of using a single photoresist layer to define both metal contact vias and metal lift-off areas on semiconductor integrated circuits. The methods use positive photoresist containing a small amount of base such as imidazole to provide a lift-off overhang when the resist is exposed and developed to provide a reversal image.

One method includes the steps of exposing selected regions of a layer of photoresist deposited on the surface of an integrated circuit, developing said image to remove the exposed photoresist to form a positive image, etching, exposing other selected regions of said photoresist layer to a negative image, baking the layer of photoresist to decarboxylate and fix the negative image in said layer of photoresist rendering all remaining unexposed regions of the said layer of photoresist, alkali soluble removing the alkali soluble regions of said photoresist, depositing metallurgy over the surface of the circuit and then removing the negative image formed in the layer of photoresist.

A different method uses similar steps but in a different order. This second method first exposes and fixes the negative image which is not developed. The positive image is then exposed and developed to leave either unexposed resist or negative image exposed resist regions. The previously unexposed resist is rendered soluble in alkali developer and removed. Metal deposition and lift-off steps complete the method.

17 Claims, 14 Drawing Figures

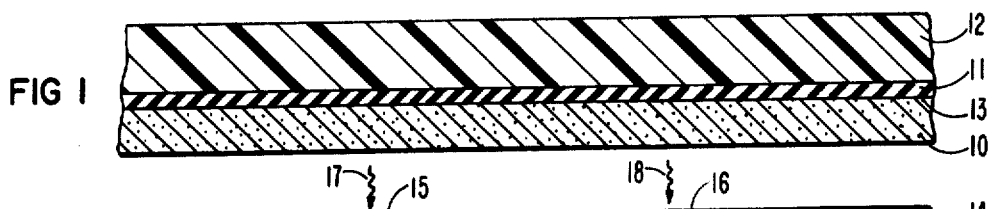
FIG 1
FIG 2
FIG 3
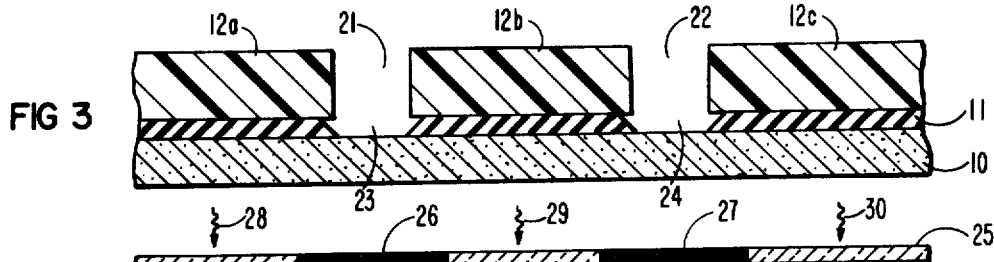
FIG 4
FIG 5
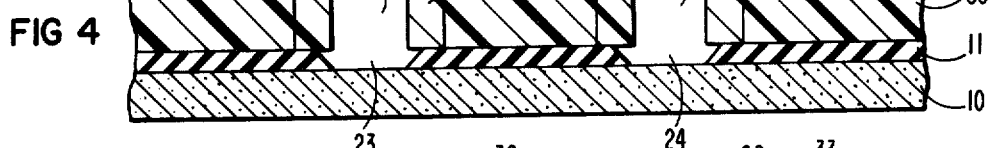
FIG 6
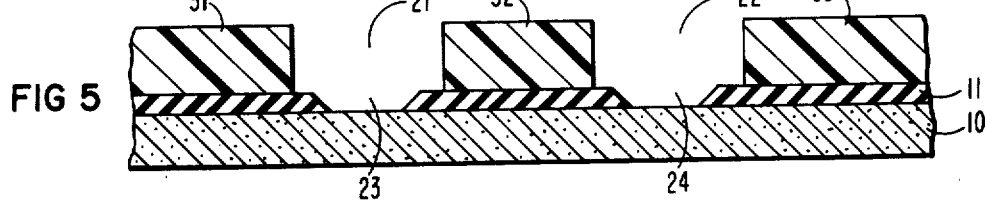
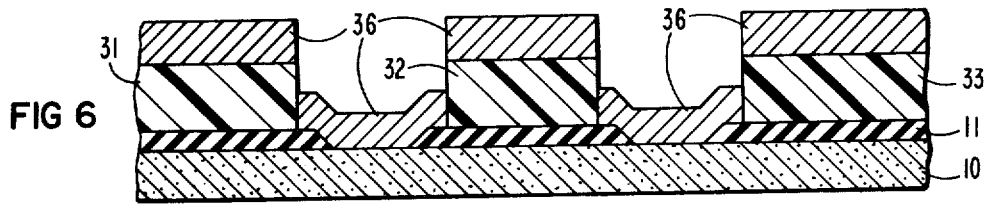
FIG 7
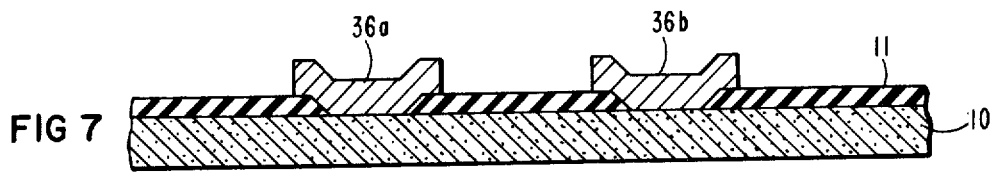

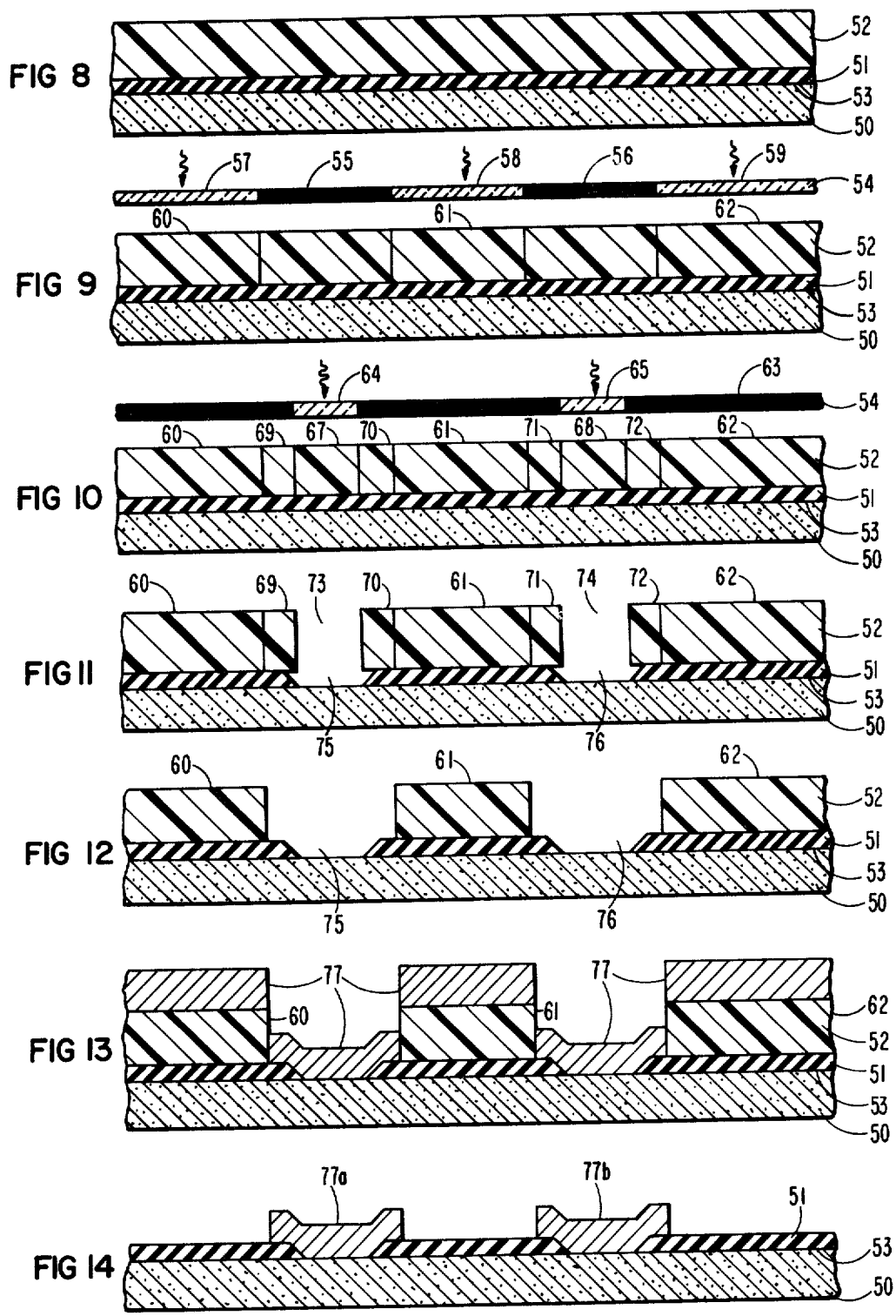

METHODS OF SIMULTANEOUS CONTACT AND METAL LITHOGRAPHY PATTERNING

BACKGROUND OF THE INVENTION

1. Field of the Invention

This invention relates generally to methods of forming metallurgy on semiconductor integrated circuits and more particularly to a process for forming such metallurgy using a single layer of photoresist in which both negative and positive images can be developed to allow all the metallurgy needed on the device to be defined using the single layer of photoresist. 2. Description of the Prior Art The application of lithography in the manufacture of integrated circuits is well known to the art. Generally speaking such lithographic processes, as practiced in the semiconductor art, include deposition of a layer of photoresist material on the surface of the body. The photoresist material usually comprises a polymer with additives therein. The coated body can be then exposed to electromagnetic radiation, such as, for example light, electron beams, etc., in order to change the solubility of the exposed portions of the photoresist layer. The layer is then developed with selective solvents which remove the soluble portions of the layer and uncover surface areas on the surface of the body. To form different portions of the final metallurgy that is desired on the surface of the body using the prior art multiple resist layers are deposited, patterned, exposed and developed and removed. With each layer defining a different pattern or portion of the final metallurgy necessitates that each such layer of resist and pattern to be carefully aligned with respect to the previously processed layers and patterns. As device become smaller alignment problems, using multiple layers of resist, increase resulting in a yield decrease.

SUMMARY OF THE INVENTION

The present invention avoids these problems by utilizing a single resist to form all the required contacts and metallurgy on a device. The process is adaptable to a self-alignment technique which eliminates all the alignment problems associated with the prior art.

In accordance with this invention a single resist layer is formed on the surface of a semiconductor body exposed through two different masks so that both positive and negative images can be independently developed in the photoresist. Thus, a plurality of different exposed regions can be formed at different times so that all the contacts and metallurgy required on the surface of the device can be created in a single step.

In a first method, contemplated by the present invention, the semiconductor body is coated with a photoresist layer in which a positive image is developed. This leaves large areas of the photoresist layer remaining on the surface of the body. Selected portions of the remaining photoresist areas are now exposed through a mask to expose a negative image. The photoresist is then baked to decarboxylate and fix the exposed photoresist containing the negative image. That is the negative image containing photoresist is rendered alkali insoluble. All remaining, unexposed photoresist is then blanket exposed to render it alkali soluble so it can be readily removed without affecting the decarboxylated negative image. Following the deposition of the metallurgy the remaining photoresist, i.e., the decarboxylated negative image can be removed to create the desired, defined metallurgy.

The second method uses similar steps but in a different order such that a self-aligned mask is formed. This is accomplished by first exposing, decarboxylating, and fixing the desired negative image in the photoresist, then exposing, developing, and etching the desired positive image to leave both the unexposed resist and the negative image resist. Following this etching of the positive image exposed resist the coated wafer is then blanked exposed to render all the remaining unexposed resist alkali soluble. Metal deposition and lift-off complete the process to define the desired metallurgy of the device.

The normally positive photoresist can be made to accommodate both negative and positive images if it is provided with a small amount of a base such as imidazole.

The foregoing and other steps, features and advantages of the invention will be apparent of the following more particular description of preferred embodiments of the invention as illustrated in the accompanying drawings.

DESCRIPTION OF THE DRAWINGS

FIGS. 1 through 7 are sectional views of the processing sequence used on a semiconductor substrate in accordance with the first method of the invention.

FIGS. 8 through 14, illustrate a second method in accordance with the invention.

DETAILED DESCRIPTION OF THE INVENTION

Photolithographic techniques employing both etching and so-called metallic lift-off processes as practiced in the semiconductor industry are well known. Generally such photolithography is based upon the utilization of photoresist which is herein used to describe any polymer with additives therein which when exposed to electromagnetic radiation, i.e. light, electrons, and etc. will cause its solubility to change.

Exposure to electromagnetic radiation causes a chemical reaction to begin in the photoresist. The reaction progresses on the basis of a time-dosage dependency. The degree of the chemical relation thus depends upon the total amount of energy and the total amount of time it is applied to the photoresist material during exposure. By balancing all the variables, latent images can be produced in the photoresist material.

If any portions of the photoresist are shielded or masked from the radiation used for exposure those portions of the photoresist so masked remain in an unaltered state.

FIGS. 1 through 7 illustrate one processing technique sequence as contemplated by the present invention. A substrate 10 has its surface 13 coated with an insulating layer such as a layer of oxide 11 which is in turn overcoated with a layer of positive photoresist 12 such as a phenolic resin with quinone-diazide sensitizers such as commercially available under the trade names Shipley AZ1350J or Hunt 204. Any positive photoresist containing a basic material such as an imidiazode base will be suitable. The process requirements and parameters used for coating the semiconductor body with the oxide and the photoresist are well known to the art.

In FIG. 2, a mask 14 is positioned over the photoresist coated substrate 10. For sake of convenience this will be referred to as a positive mask. This mask 14 can be either a contact mask, in contact with the surface of the photoresist, or a non-contact separated mask held away from the photoresist by acceptable means (not shown). Such masks are comprised of optically transparent and optically opaque areas. The mask 14 is shown as being generally opaque but provided with optically transparent or clear openings, 15 and 16 therein. Through these openings suitable electromagnetic radiation such as ultraviolet light, electrons, ions, etc., indicated by arrows 17 and 18 is permitted to pass into the photoresist layer exposing therein the areas 19 and 20. The mask is then removed and while protecting the photoresist layer from further exposure it is treated with a developer such as by immersing the body in a 0.23 normal potassium hydroxide solution (not shown) which dissolves and removes the exposed areas 19 and 20 to leave openings 21 and 22 in the photoresist 12 as shown in FIG. 3.

This removal of areas 19 and 20 results in photoresist layer 12 being segregated into three photoresist islands 12a, 12b and 12c. Once the openings 21 and 22 are provided in the photoresist layer 12 the underlying silicon dioxide layer 11 is subjected to a suitable etchant such as hydrofluoric acid which removes the thin silicon dioxide layer 12 beneath the openings 21 and 22 leaving metal contact openings or vias 23 and 24 in the oxide as shown in FIG. 4.

The surface 13 is thus exposed in the openings 23 and 24. In this embodiment this acid treatment, in forming these openings 23 and 24 undercuts the adjacent photoresist. Thus it is preferable to remove the photoresist overlying the undercut openings 23 and 24. This is accomplished as follows. In FIG. 4 a different mask 25, i.e., a negative mask, is now positioned over the photoresist layer as to shield the previously formed openings 21 and 22 in the photoresist. Thus, this mask is shown as basically the reverse or complement of the original mask and is generally optically transparent with two optically opaque areas 26 and 27 which not only shield the previously exposed openings 21 and 22, formed in the photoresist, but also an area around the edges of the openings thereof. The amount of overlap of the opaque areas 26 and 27 around the openings 21 and 22 is greater than the amount that the oxide openings 23 and 24 undercut the photoresist islands 12a, 12b and 12c during the previously described operation. Portions 31, 32 and 33 of the photoresist islands 12a, 12b and 12c are exposed to radiation through the optically clear areas of mask 25. This radiation is indicated by arrows 28, 29 and 30. Again the radiation creates a photochemical reaction in the exposed portions 31, 32 and 33 of the islands 12a, 12b, and 12c while the unexposed areas 34 and 35 immediately adjacent the openings 21 and 22 remain unaltered. The radiation exposed substrate is now placed in a low temperature oven and baked. This baking causes portions 31, 32 and 33, in islands 12a, 12b and 12c, exposed to the radiation to decarboxylate the decomposition product created in the photoresist by the exposure to the radiation and become substantially insoluble in alkali solutions such as the usual potassium hydroxide resist developer. Typically, heating levels of approximately 95° C. for about ten minutes will cause the desired condition in the exposed portions 31, 32 and 33. The areas 34 and 35 remain unaltered and unaffected by this baking. Upon completion of this baking step, the unit is removed from the oven and again subjected to radiation which now renders previously unexposed photoresist material 34 and 35 immediately adjacent the openings 21 and 22 alkali soluble. This material is now dissolved in a 0.095 normal solution of potassium hydroxide causing the openings 21 and 22 to become substantially enlarged. On the surface of the device there now remains only the final relief image which comprises exposed, baked, hardened, photoresist portions 31, 32 and 33.

The unit is now placed in an evaporator (not shown) and a thin metal layer 36 such as aluminum is deposited on the entire surface of the device. This metal layer not only coats the baked exposed photoresist portions 31, 32 and 33 but also deposits them in the enlarged openings 21 and 22 to contact the exposed substrate surface 13. Once this metal layer has been deposited, the entire unit is placed in a strong developer or stripper such as N-methyl-2-pyrrolidone or butyl acetate which removes the baked, hardened photoresist portions 21, 32 and 33. Only the metal in those areas in the intervening spaces 21 and 22 between the photoresist portions 31, 32 and 33 as shown in FIG. 7 by metallic layers 36a and 36b remain on the surface of the device.

Thus, there has been disclosed a method for exposing selected regions of a layer of photoresist deposited on the oxidized surface of an integrated circuit and developing the image to remove the exposed photoresist to form a positive image, etching the oxide on the surface, exposing other regions of said photoresist layer to form a negative image of the first formed image, baking the layer of photoresist to decarboxylate and fix the negative image in the layer of photoresist, blanket exposing the photoresist layer so as to render all the remaining unexposed regions of the layer of photoresist alkali soluble, removing the alkali soluble photoresist, so that when metallurgy is deposited on the surface of the circuit the baked, hardened negative image can be removed and lift-off undesirable metallurgical metal deposits.

There has been described a method of using a single photoresist layer to define both the metal contact vias and the metal lift-off areas on semiconductor integrated circuits.

It should be understood that the negative mask need not be the complement of the pattern of the positive mask but would be an entirely different pattern and can be used for example to define interconnecting metallurgy between the openings 21 and 22.

FIGS. 8 through 14 illustrate a second method or processing technique also contemplated by this present invention. A substrate 50 has its surface 53 coated with a layer of oxide 51 which is in turn overcoated with a layer of photoresist 52 such as described above in FIG. 1. Again the process requirements and parameters used for coating the semiconductor body with the oxide and the photoresist are well known to the art.

In FIG. 9 a mask 54 is positioned over the resist coated substrate. In this instance the mask 54 is a negative mask. Again the mask can be either a contact or a noncontact mask. The mask 54 is shown as being generally clear, but provided with optically opaque regions 55 and 56 which separate optically clear regions 57, 58 and 59. Through these openings 57, 58 and 59 suitable electromagnetic radiation as indicated by the arrows is permitted to pass into the photoresist layer 52 exposing therein the regions 60, 61 and 62. At this point and time the substrate is placed in a low temperature oven and baked to decarboxylate and render alkali insoluble the exposed regions 60, 61 and 62.

Once again as described above heating levels of approximately 95° C. for about 10 minutes are used. Upon completion of the baking step the unit is removed from the oven and a positive mask 63 is positioned over the unit. The mask 63 comprises a generally opaque mask having transparent openings 64 and 65 therein. These optically transparent regions 64 and 65 are located within the boundaries of and are smaller than the opaque regions 55 and 56 found on the negative mask 54 used in the previous step. At this time radiation is permitted to pass through the regions 64 and 65 to cause the regions of the photoresist 67 and 68 immediately thereunder to now become exposed. At this point and time the photoresist layer has been modified so that there are now three divisions with different characteristics. Thus regions 60, 61 and 62 have been exposed and decarboxylated; regions 67 and 68 have been exposed only; and regions 69, 70, 71 and 72 remain unexposed and unaltered.

The next step, as shown in FIG. 11, requires that the exposed regions 67 and 68 be removed, using the standard 0.23 potassium hydroxide photoresist developer, to leave opening 73 and 74 in the photoresist. The now exposed underlying oxide layer 51 on the surface 53 of the body 50 is now treated with hydrofluoric acid and vias 75 and 76, defined by the openings 73 and 74, are made therein and undercut the openings 73 and 74 in the photoresist as shown.

Once these openings have been created in the oxide layer 51 the unexposed regions of photoresist 69, 70, 71, and 72 are first exposed to render them alkali soluble and are then removed using a developer comprised of an alkali solution such as 0.095 potassium hydroxide. The removal of these regions thus greatly enlarges the openings 73 and 74 and leaves only the exposed baked regions 60, 61, and 62 remaining on the oxide surface, as shown in FIG. 12.

The unit is now placed in a metal evaporator and a metal layer 75 such as aluminum is deposited over the entire surface as shown in FIG. 13.

Once the metal layer 75 is deposited the exposed, baked, decarboxylated regions 60, 61, and 62 are removed from the surface of the unit through use of a stripper such as N-methyl-2-pyrrolidone causing only the metal islands 77a and 77b to remain on the surface of the unit as shown in FIG. 14.

Thus a second method of forming both positive and negative images in a single layer of photoresist has been taught so as to define both the vias and the metal in contact with these vias.

It should be understood that improvements, changes or modifications in form and detail could be made to the described embodiments without departing from the spirit and scope of the invention.

What is claimed is:

1. A photolithographic method of processing a photoresist in which both positive and reversal image processes are sequentially carried out in a single layer of positive photoresist containing a basic material, each of said image processes comprising an exposure step and a development step performed in said single layer of positive photoresist.

2. A photolithographic process in which a first latent image is exposed and fixed in a layer of positive photoresist containing a basic material, a second image is exposed, developed and used to form a relief pattern in a layer of material on a substrate, the first image is developed to form a second relief image and is used to define a different pattern in a layer on the substrate.

3. A lithographic method in which both positive and reversal image processes are sequentially carried out in a single layer of photoresist comprising the steps of:
applying, drying, exposing and developing a selected region of positive photoresist containing a basic material deposited on the surface of a body to provide a positive image defining a contact area on said surface,
re-exposing the remaining photoresist with a negative mask defining a selected zone which includes the previously defined contact area,
baking for a period of time to decarboxylate the decomposition products formed in the photoresist in the re-exposed zone, thus fixing the negative image in the photoresist,
blanket exposing the entire body to render alkali soluble the remaining photoresist which has not previously been exposed, and
developing, in a weak alkaline developer to remove said alkali soluble photoresist from the surface of the body leaving the re-exposed, baked decarboxylated photoresist on said surface.

4. The method of claim 3 which further includes the steps of depositing a metal layer on the exposed surface of said body and said re-exposed, baked, decarboxylated photoresist, and removing the remaining re-exposed, baked photoresist and any overlying metal to define a selected pattern of metal on said surface.

5. The method of claim 4 wherein said photoresist comprises a positive photoresist, with an imidazole base.

6. The method of claim 4 wherein said photoresist comprises a phenolic resin containing a quinone-diazide sensitizer.

7. The method of claim 6 wherein said selected region is developed with a 0.23 normal solution of potassium hydroxide.

8. The method of claim 7 wherein said weak alkaline developer is a 0.095 normal solution of potassium hydroxide.

9. The method of claim 8 wherein said baked photoresist is removed by N-methyl-2-pyrrolidone.

10. A photolithographic method of processing a semiconductor in which both positive and reversal image processes are sequentially carried out in a single layer of positive photoresist containing a basic material comprising the steps of:
applying, drying, exposing and developing selected regions of a photoresist on the oxide coated surface of a semiconductor body to provide a positive image defining contact via areas in said oxide coating,
etching said vias while protecting the unexposed remaining photoresist from exposure,
re-exposing the remaining photoresist with a negative mask defining contact metallurgy in zones which include the previously defined vias,
baking for a period of time to decarboxylate the decomposition products formed in the photoresist in the re-exposed zones, thus fixing the negative image in the photoresist,
blanket exposing the entire body to render alkali soluble the remaining photoresist which have not previously been exposed,
developing, in a weak alkaline developer to remove said alkali soluble photoresist the re-exposed, baked, decarboxylated photoresist in all areas where metallurgy is not wanted, and depositing metal on the semiconductor and removing the remaining re-exposed, baked, photoresist and any overlying metal.

11. A lithographic method in which both positive and reversal image processes are sequentially carried out in a single layer of positive photoresist containing a basic material comprising the steps of:

applying, drying and exposing selected portions of the photoresist deposited on the surface of a body, to form a negative image defining a contact area to be created on the surface, baking for a period of time to decarboxylate the decomposition products of the photoresist in the exposed area, thus fixing the negative image in the photoresist, exposing a contact zone within the defined contact area by exposing the area through a positive mask and developing said zone to expose selected regions on the surface of the body, blanket exposing the entire body to render alkali soluble all previously unexposed photoresist, treating the body with a week alkaline developer to remove the alkali soluble photoresist leaving the baked photoresist on said surface, and removing the remaining baked photoresist.

12. A photolithograhic method of processing a photoresist in which both positive and reversal image processes are sequentially carried out in a single layer of positive photoresist containing a basic material comprising the steps of:

applying, drying and exposing selected portions of the photoresist on the oxide coated surface of a semiconductor body, through a negative mask defining contact areas to be created on the body, baking for a period of time to decarboxylate the decomposition products of the photoresist in the exposed areas, thus fixing the negative image in the photoresist, exposing contact zones within the defined contact areas by exposing the defined contact areas through a positive mask, and developing said zones to expose selected regions on the oxide coated surface, etching vias through said oxide in said regions while protecting the unexposed remaining photoresist from exposure, blanket exposing the entire body to render alkali soluble all previously unexposed photoresist, treating the body with a weak alkaline developer to remove the alkali soluble photoresist leaving the baked photoresist on said surface in all areas where metallurgy is not wanted, depositing metal on said body and removing the remaining baked photoresist and any overlying metal.

13. The method of claim 12 wherein said photoresist comprises a positive photoresist, with an imidazole base.

14. The method of claim 12 wherein said photoresist comprises a phenolic resin containing a quinone-diazide sensitizer.

15. The method of claim 14 wherein said selected region is developed with a 0.23 normal solution of potassium hydroxide.

16. The method of claim 15 wherein said weak alkaline developer is a 0.095 normal solution of potassium hydroxide.

17. The method of claim 16 wherein said baked photoresist is removed by N-methyl-2-pyrrolidone.

* * * * *